US012564987B2

(12) United States Patent
Khusnatdinov

(10) Patent No.: US 12,564,987 B2
(45) Date of Patent: Mar. 3, 2026

(54) APPARATUS AND METHOD FOR CURING FORMABLE MATERIAL

(71) Applicant: CANON KABUSHIKI KAISHA, Tokyo (JP)

(72) Inventor: Niyaz Khusnatdinov, Round Rock, TX (US)

(73) Assignee: Canon Kabushiki Kaisha, Tokyo (JP)

( * ) Notice: Subject to any disclaimer, the term of this patent is extended or adjusted under 35 U.S.C. 154(b) by 86 days.

(21) Appl. No.: 18/483,076

(22) Filed: Oct. 9, 2023

(65) Prior Publication Data

US 2025/0114983 A1 Apr. 10, 2025

(51) Int. Cl.
| | |
|---|---|
| *B29C 35/08* | (2006.01) |
| *B05D 3/00* | (2006.01) |
| *B05D 3/12* | (2006.01) |
| *G03F 7/00* | (2006.01) |
| *G03F 7/09* | (2006.01) |

(52) U.S. Cl.
CPC .......... *B29C 35/0805* (2013.01); *B05D 3/007* (2013.01); *B05D 3/12* (2013.01); *G03F 7/0002* (2013.01); *G03F 7/094* (2013.01); *B29C 2035/0827* (2013.01)

(58) Field of Classification Search
CPC ........ B29C 2035/0827; B29C 35/0805; B05D 3/12; B05D 3/007; H01L 21/31051; G03F 7/0002; G03F 7/094
See application file for complete search history.

(56) References Cited

U.S. PATENT DOCUMENTS

| | | | | |
|---|---|---|---|---|
| 4,377,339 | A * | 3/1983 | Coppock | .............. G03F 7/70866 355/39 |
| 5,253,110 | A | 10/1993 | Ichihara et al. | |
| 6,636,295 | B2 * | 10/2003 | Shiozawa | ........... G03F 7/70566 355/71 |

(Continued)

FOREIGN PATENT DOCUMENTS

| | | | |
|---|---|---|---|
| EP | 3659783 A1 | 6/2020 | |
| JP | 2007052145 A | * | 3/2007 |
| KR | 10-20150112271 A | 10/2015 | |

OTHER PUBLICATIONS

Translation JP-2007052145, Sakai, Mar. 2007. (Year: 2007).*

*Primary Examiner* — Philip C Tucker
*Assistant Examiner* — Jimmy R Smith, Jr.
(74) *Attorney, Agent, or Firm* — Canon U.S.A., Inc. IP Division

(57) ABSTRACT

Apparatuses and methods are provided for curing formable material between a substrate and a superstrate. The apparatus may include a substrate chuck configured to hold the substrate and a plurality of light sources configured to provide a uniform distribution of light to a surface of the formable material in contact with a featureless surface of the superstrate, the plurality of light sources having mixed polarizations relative to each other. The apparatus may include a light source configured to provide light to the formable material on the substrate and a controller configured to control rotation of at least one of the substrate chuck and the light source to provide a uniform distribution of light to a surface of the formable material in contact with a featureless surface of the superstrate. The formable material between the substrate and the superstrate may form a planarized layer on the substrate.

7 Claims, 14 Drawing Sheets

(56)                    References Cited

U.S. PATENT DOCUMENTS

|  |  |  |  |  |
|---|---|---|---|---|
| 8,409,671 | B2 | 4/2013 | Ozawa et al. | |
| 8,926,304 | B1 | 1/2015 | Chen | |
| 10,754,078 | B2 | 8/2020 | Bamesberger | |
| 11,092,719 | B1 | 8/2021 | Zhu | |
| 11,107,678 | B2 | 8/2021 | Choi | |
| 2009/0102988 | A1 | 4/2009 | Maeda et al. | |
| 2022/0102167 | A1* | 3/2022 | Shackleton | H01L 21/67092 |
| 2022/0352014 | A1 | 11/2022 | Choi | |
| 2024/0333889 | A1* | 10/2024 | Gu | H04N 9/3155 |

* cited by examiner

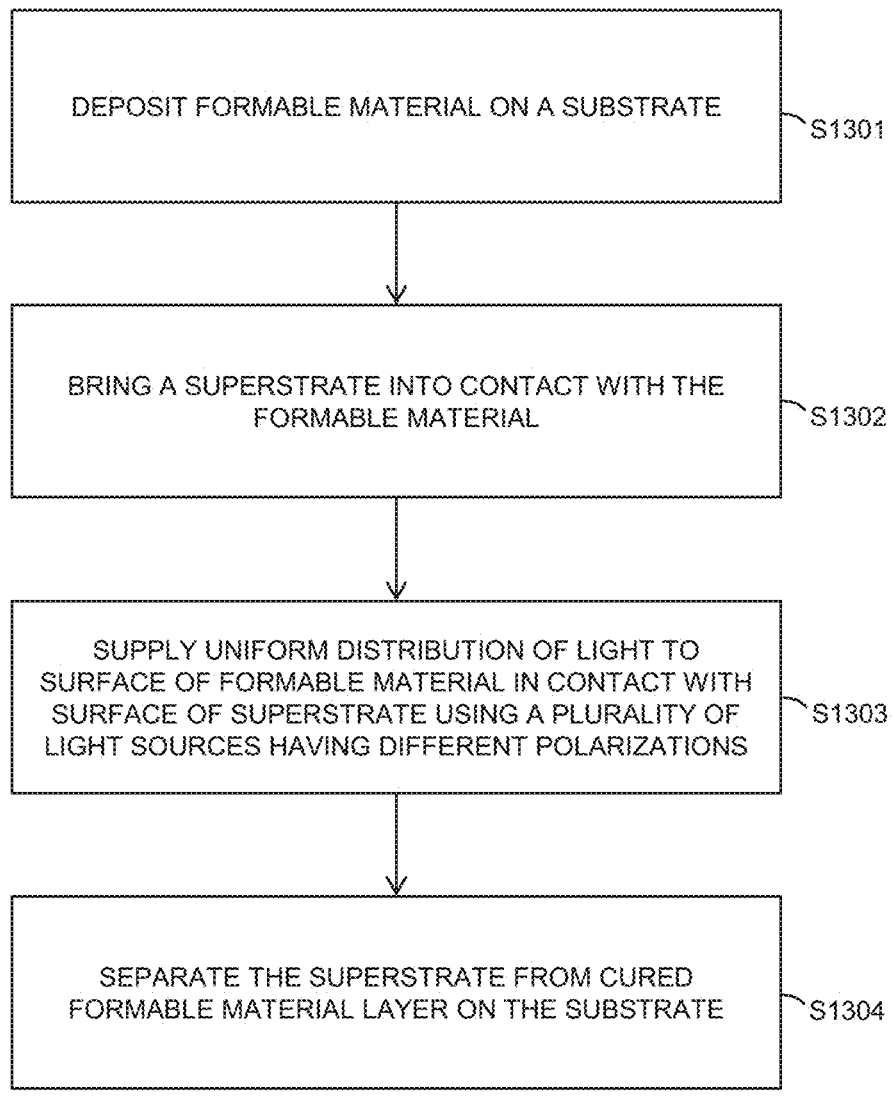

DEPOSIT FORMABLE MATERIAL ON A SUBSTRATE ⌐S1301

BRING A SUPERSTRATE INTO CONTACT WITH THE FORMABLE MATERIAL ⌐S1302

SUPPLY UNIFORM DISTRIBUTION OF LIGHT TO SURFACE OF FORMABLE MATERIAL IN CONTACT WITH SURFACE OF SUPERSTRATE USING A PLURALITY OF LIGHT SOURCES HAVING DIFFERENT POLARIZATIONS ⌐S1303

SEPARATE THE SUPERSTRATE FROM CURED FORMABLE MATERIAL LAYER ON THE SUBSTRATE ⌐S1304

FIG. 13

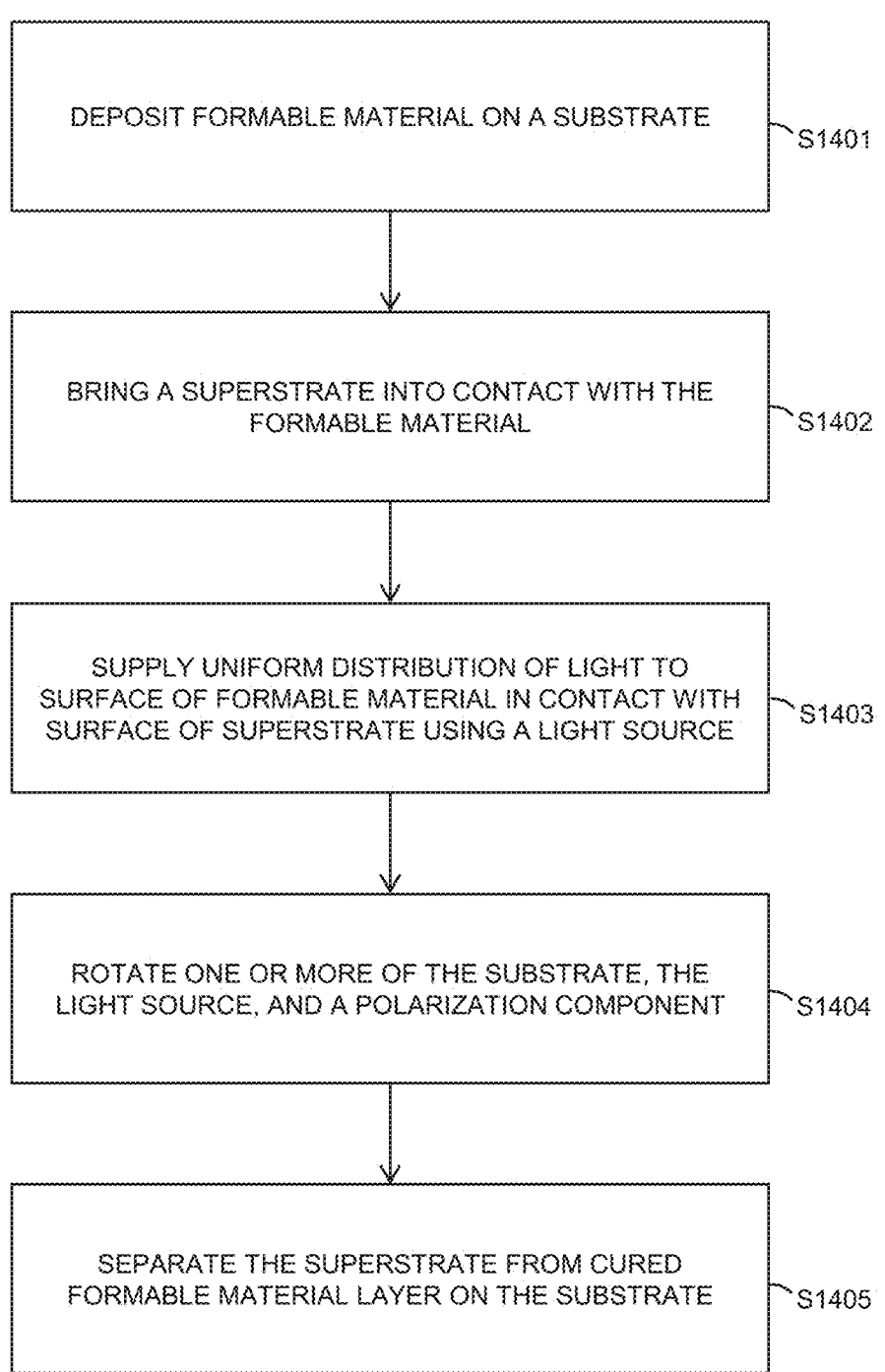

DEPOSIT FORMABLE MATERIAL ON A SUBSTRATE    ~S1401

BRING A SUPERSTRATE INTO CONTACT WITH THE FORMABLE MATERIAL    ~S1402

SUPPLY UNIFORM DISTRIBUTION OF LIGHT TO SURFACE OF FORMABLE MATERIAL IN CONTACT WITH SURFACE OF SUPERSTRATE USING A LIGHT SOURCE    ~S1403

ROTATE ONE OR MORE OF THE SUBSTRATE, THE LIGHT SOURCE, AND A POLARIZATION COMPONENT    ~S1404

SEPARATE THE SUPERSTRATE FROM CURED FORMABLE MATERIAL LAYER ON THE SUBSTRATE    ~S1405

FIG. 14

APPARATUS AND METHOD FOR CURING FORMABLE MATERIAL

FIELD

The present disclosure relates to wafer processing, and more particularly, to the curing process of surfaces in semiconductor fabrication.

BACKGROUND

Planarization techniques are useful in fabricating semiconductor devices. A planarization technique sometimes referred to as inkjet-based adaptive planarization (IAP) involves dispensing a variable drop pattern of polymerizable material between the substrate and a superstrate, where the drop pattern varies depending on the substrate topography. A superstrate is then brought into contact with the polymerizable material after which the material is polymerized on the substrate, and the superstrate removed. Improvements in planarization techniques, including IAP techniques, are desired for improving, for example, whole wafer processing and semiconductor device fabrication.

SUMMARY

Some embodiments of the present disclosure provide an apparatus for curing formable material between a substrate and a superstrate, the apparatus including a substrate chuck configured to hold the substrate and a plurality of light sources configured to provide a uniform distribution of light to a surface of the formable material in contact with a featureless surface of the superstrate, wherein the plurality of light sources have mixed polarizations relative to each other.

Some embodiments of the present disclose provide an apparatus for curing formable material between a substrate and a superstrate, the apparatus including a substrate chuck configured to hold the substrate, a light source configured to provide light to the formable material on the substrate, and a controller configured to control rotation of at least one of the substrate chuck and the light source to provide a uniform distribution of light to a surface of the formable material in contact with a featureless surface of the superstrate.

Some embodiments of the present disclosure provide a method of curing formable material between a substrate and a superstrate, the method including holding the substrate including the formable material and supplying a uniform distribution of light to a surface of the formable material in contact with a featureless surface of the superstrate to cure the formable material between the substrate and the superstrate, the cured formable material forming a planarized layer on the substrate, wherein the uniform distribution of light incident to the surface of the formable material has multiple different polarizations.

Further features of the present disclosure will become apparent from the following description of exemplary embodiments with reference to the attached drawings, in which like reference characters designate the same or similar parts throughout the figures thereof.

BRIEF DESCRIPTION OF THE DRAWINGS

FIG. 13 illustrates an operational flow of an example planarization method according to some embodiments of the present disclosure.

FIG. 14 illustrates an operational flow of an example planarization method according to some embodiments of the present disclosure.

DETAILED DESCRIPTION

The following paragraphs describe certain explanatory embodiments. Other embodiments may include alternatives, equivalents, and modifications. Additionally, the explanatory embodiments may include several features, and a particular feature may not be essential to some embodiments of the devices, systems, and methods that are described herein. Furthermore, some embodiments include features from two or more of the following explanatory embodiments. Also, as used herein, the conjunction "or" generally refers to an inclusive "or," although "or" may refer to an exclusive "or" if expressly indicated or if the context indicates that the "or" must be an exclusive "or."

Figure 1A:
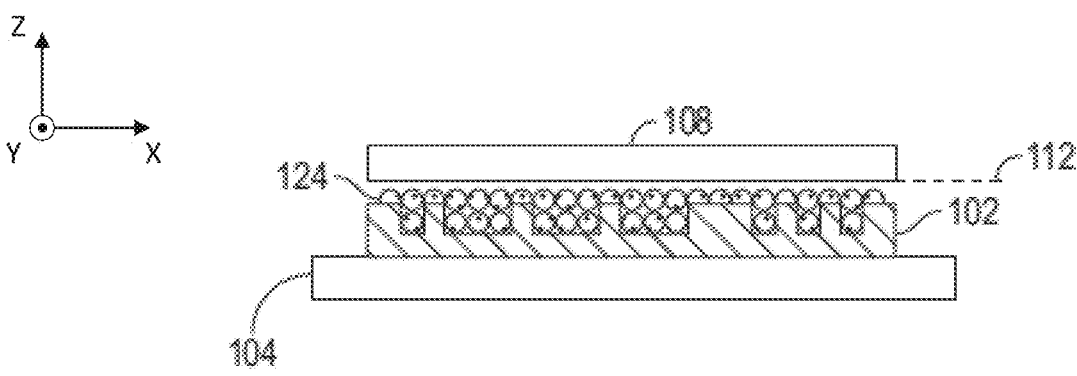
FIGS. 1A to 1C illustrate a planarization process according to some embodiments of the present disclosure.
Figure 1B:
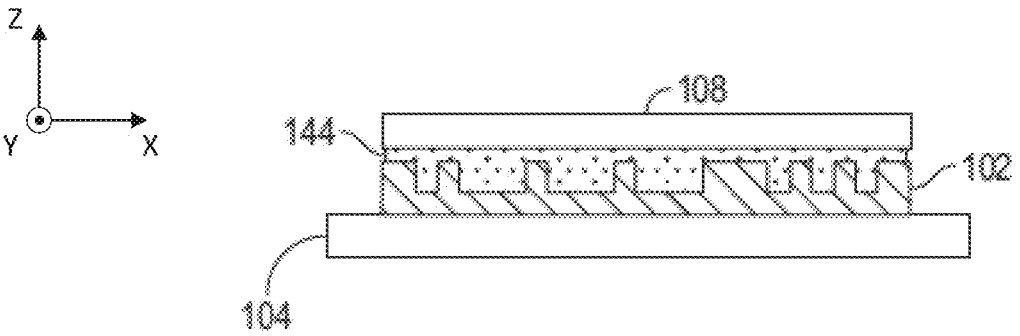
Figure 1C:
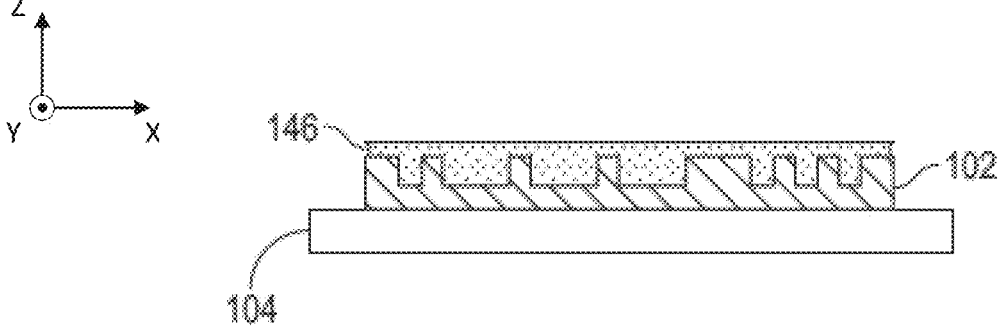

FIGS. 1A to 1C illustrate a planarization process according to some embodiments of the present disclosure. The planarization process includes steps which are shown schematically in FIGS. 1A-1C. As illustrated in FIG. 1A, the formable material 124 is dispensed in the form of droplets onto the substrate 102. As discussed previously, the substrate surface has some topography which may be known based on previous processing operations or may be measured using a profilometer, AFM, SEM, or an optical surface profiler based on optical interference effect like Zygo NewView 8200. The local volume density of the deposited formable material 124 is varied depending on the substrate topography. The superstrate 108 is then positioned in contact with the formable material 124. The superstrate 108 has a working surface 112 facing and spaced apart from the substrate 102.

FIG. 1B illustrates a post-contact step after the superstrate 108 has been brought into full contact with the formable material 124 but before a polymerization process starts. As the superstrate 108 contacts the formable material 124, the droplets merge to form a formable material film 144 that fills the space between the superstrate 108 and the substrate 102. Preferably, the filling process happens in a uniform manner without any air or gas bubbles being trapped between the superstrate 108 and the substrate 102 in order to minimize non-fill defects. The polymerization process or curing of the formable material 124 may be initiated with actinic radiation (e.g., ultraviolet (UV) radiation). For example, a radiation source can provide the actinic radiation causing formable material film 144 to cure, solidify, and/or cross-link, defining a cured planarized layer 146 on the substrate 102. Alternatively, curing of the formable material film 144 can also be initiated by using heat, pressure, chemical reaction, other types of radiation, or any combination of these. Once cured, planarized layer 146 is formed, the superstrate 108 can be separated therefrom. FIG. 1C illustrates the cured planarized layer 146 on the substrate 102 after separation of the superstrate 108. According to some embodiments, the formable material between the substrate and the superstrate forms a planarized layer on the substrate upon receiving the light provided by a plurality of light sources. According to some embodiments, the formable material between the substrate and the superstrate forms a planarized layer on the substrate upon receiving the light provided by a single light source where the light is polarized light in at least two orthogonal directions.

Figure 2A:
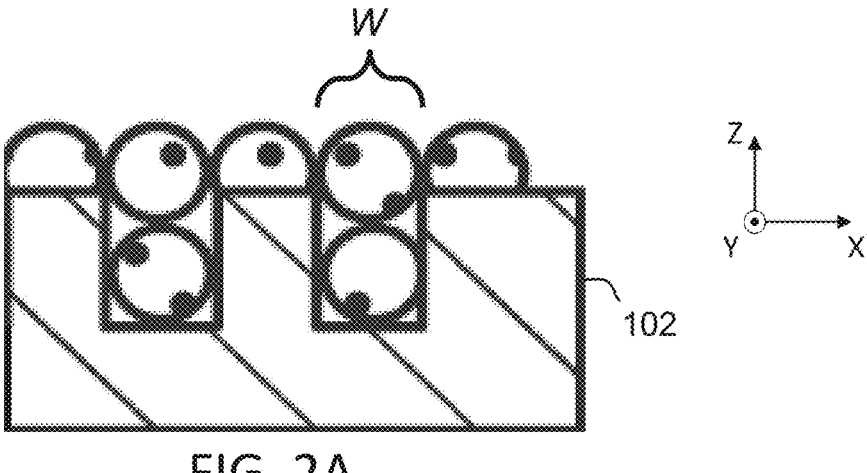
FIGS. 2A to 2B illustrate a cross section of and an orthographic view of a portion of an example substrate according to some embodiments of the present disclosure.
Figure 2B:
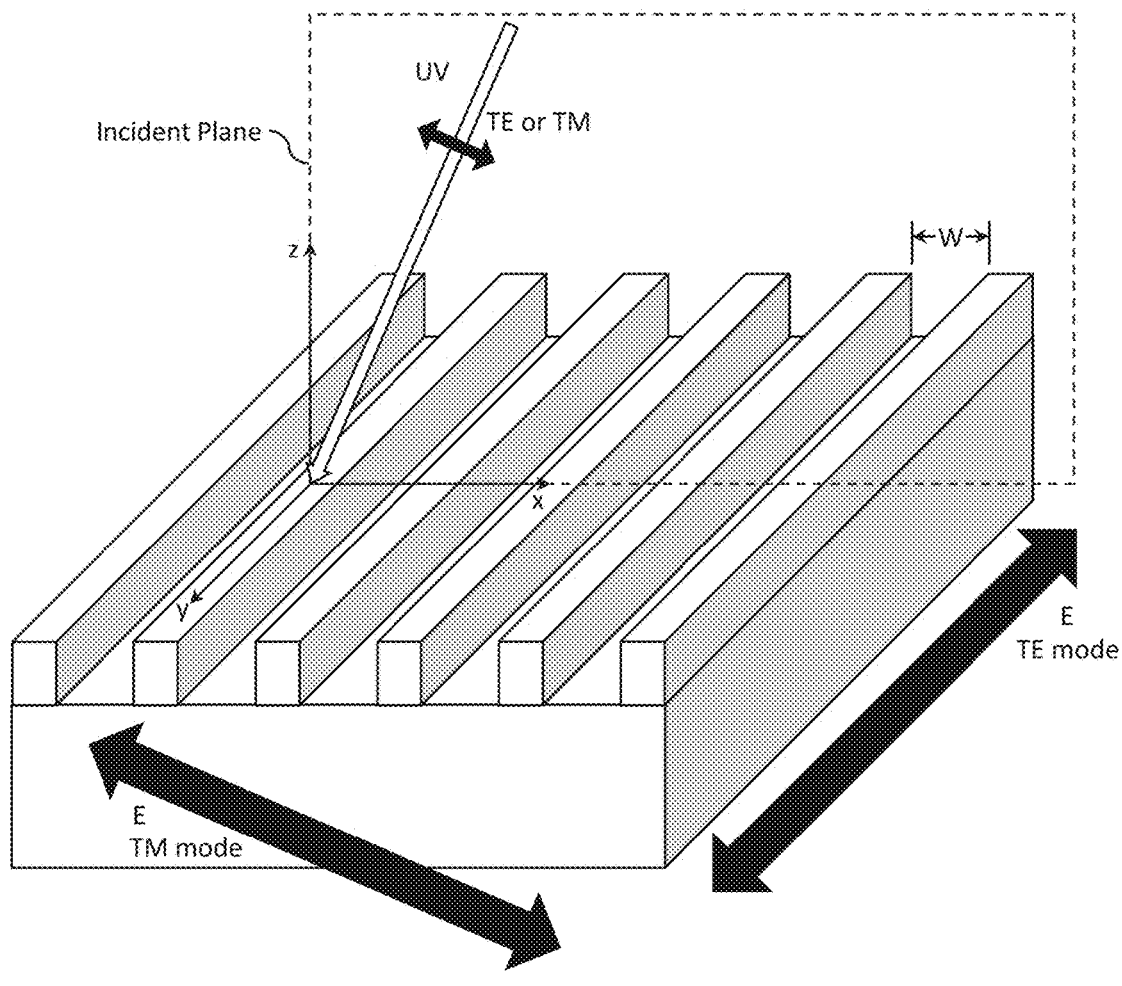
Figure 3:
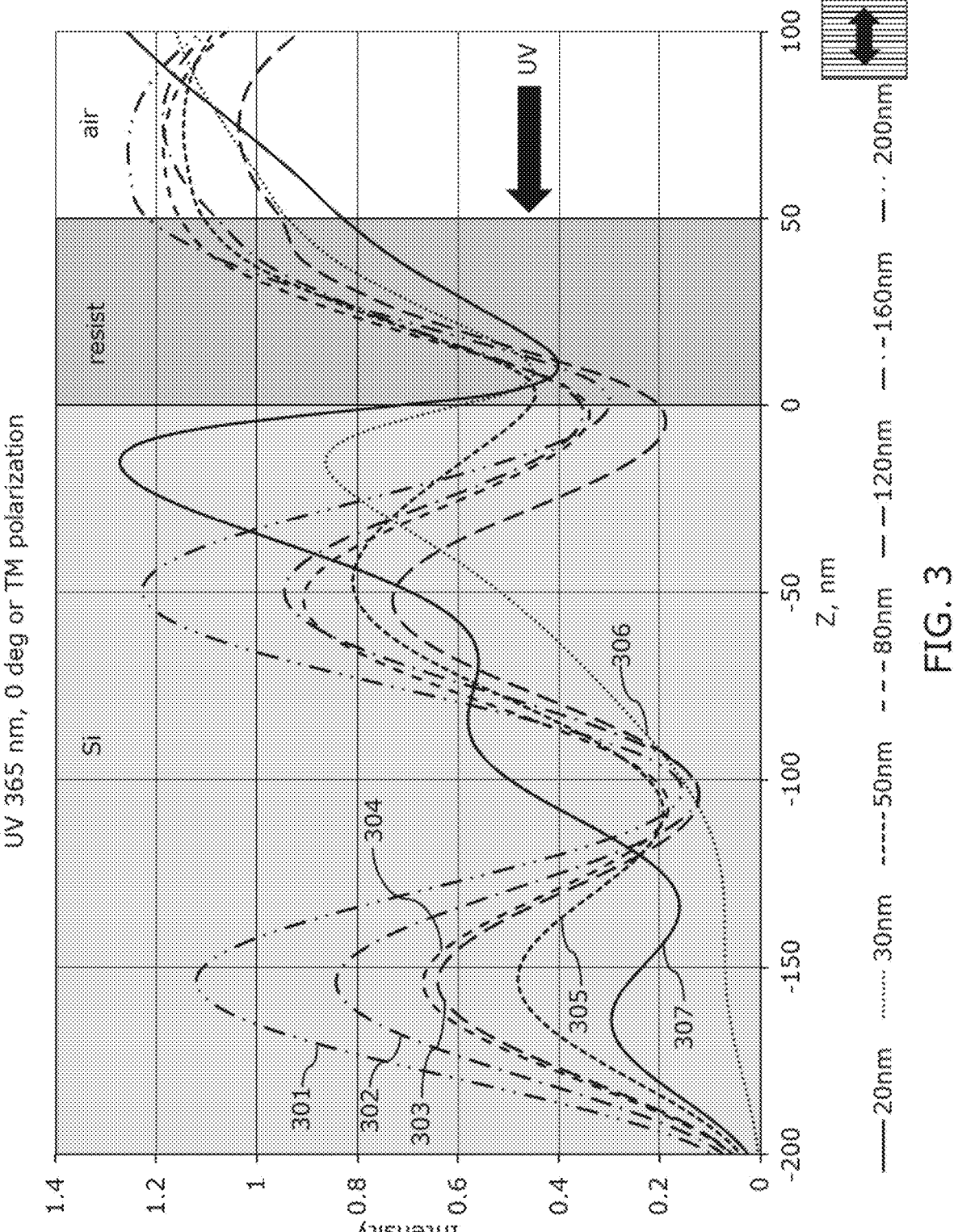
FIG. 3 illustrates an example model of intensity measurements at different depths for a variety of trench widths using transverse magnetic (TM) polarized light according to some embodiments of the present disclosure.
Figure 4:
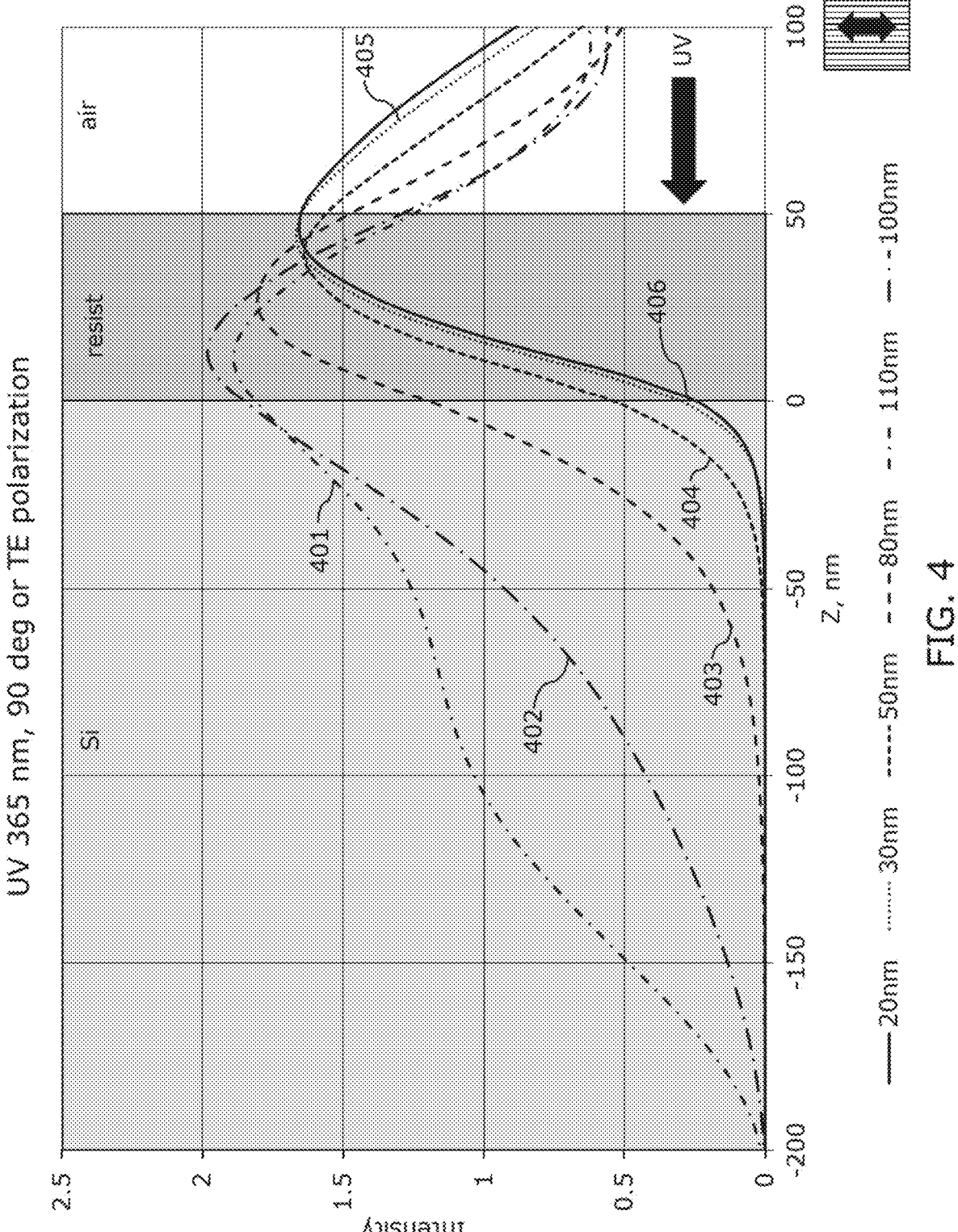
FIG. 4 illustrates an example model of intensity measurements at different depths for a variety of trench widths using transverse electric (TE) polarized light according to some embodiments of the present disclosure.

FIG. 2A illustrates a cross section of a portion of an example substrate according to some embodiments of the present disclosure. In FIG. 2A, a trench width W is shown. FIG. 2B illustrates a portion of an example substrate with a plurality of trenches having a trench width W arranged parallel to each other. During a curing process, such as described with reference to FIGS. 3 and 4, ultraviolet (UV) radiation may be polarized light. For example, different orthogonal polarized light may be applied to a substrate that includes a trench such as shown in FIG. 2B. FIG. 3 illustrates an example model of intensity measurements at different depths for a variety of trench widths using transverse magnetic (TM) polarized light according to some embodiments of the present disclosure. FIG. 4 illustrates an example model of intensity measurements at different depths for a variety of trench widths using transverse electric (TE) polarized light according to some embodiments of the present disclosure. FIG. 2B illustrates that how the UV light may have TM polarization or TE polarization. The TE and TM modes of polarization are different in orientation of the electric field relative to the incident plane. The incident plane of the UV light is orthogonal here to the direction of the trenches. If the UV light is the TM mode then the electric field of the UV light lies in the incident plane. If the UV light is in TE mode then the electric field of the UV light is perpendicular to the incident plane.

In FIG. 3, the intensity 301 corresponds to TM polarized UV light applied to a trench width of 200 nm, the intensity 302 corresponds to TM polarized UV light applied to a trench width of 160 nm, the intensity 303 corresponds to TM polarized UV light applied to a trench width of 120 nm, the intensity 304 corresponds to TM polarized UV light applied to a trench width of 80 nm, the intensity 305 corresponds to TM polarized UV light applied to a trench width of 50 nm, the intensity 306 corresponds to TM polarized UV light applied to a trench width of 30 nm, and the intensity 307 corresponds to TM polarized UV light applied to a trench width of 20 nm. The intensities are shown with respect to the Z-direction (depth) as the TM polarized UV light interacts with the formable material (resist), i.e., the formable material film 144, at different depths above the substrate 102 and different depths within trenches of various widths of the substrate 102, e.g., a silicon (Si) substrate.

In FIG. 4, the intensity 401 corresponds to TE polarized UV light applied to a trench width of 110 nm, the intensity 402 corresponds to TE polarized UV light applied to a trench width of 100 nm, the intensity 403 corresponds to TE polarized UV light applied to a trench width of 80 nm, the intensity 404 corresponds to TE polarized UV light applied to a trench width of 50 nm, the intensity 405 corresponds to TE polarized UV light applied to a trench width of 30 nm, and the intensity 406 corresponds to TE polarized UV light applied to a trench width of 20 nm. The intensities are shown with respect to the Z-direction (depth) as the TE polarized UV light interacts with the formable material (resist), i.e., the formable material film 144, at different depths above the substrate 102 and different depths within trenches of various widths of the substrate 102, e.g., a silicon (Si) substrate.

As shown in FIGS. 3 and 4, TM polarized UV light (in FIG. 3) is able to reach higher intensities at greater depths than with TE polarized UV light (in FIG. 4) at a variety of trench widths. The UV light in FIGS. 3 and 4 is 365 nm. As shown in FIG. 3, at trench widths of about 100 nm or less, the intensity of the TE polarized light interacting with the resist is substantially reduced at trench depths below 50 to 100 nm. On the other hand, TM polarized UV light applied to similar trench widths is able to reach higher intensities. Accordingly, since trenches may be arranged in a variety of orientations upon a substrate, it is advantageous to supply multiple orthogonal polarizations of light over the entirety of the substrate to ensure a high enough intensity at all trench depths, so that resist material within trenches having narrow widths relative to the wavelength of the UV light can be effectively cured. For example, when the formable material between the substrate and the superstrate is on a surface of the substrate includes a trench feature, and the width of the trench feature is smaller than an effective wavelength of the light provided by the plurality of light sources by a predetermined amount, then supplying TM polarized light will be able to cure the formable material. For example, when the width of the trench feature is smaller than an effective wavelength of the light provided by the plurality of light sources by about 50%, then supplying TM polarized light is able to cure the formable material. The effective wavelength is the wavelength of the UV light in vacuum divided by the refractive index of the formable material. Thus, it is advantageous to supply light having mixed polarizations relative to each other where the polarizations are orthogonal to each other in order to ensure that the formable material within narrow trenches is cured. For example, using systems having features such as shown in FIGS. 5-12 can ensure that the formable material within narrow trenches is cured.

Figure 5:
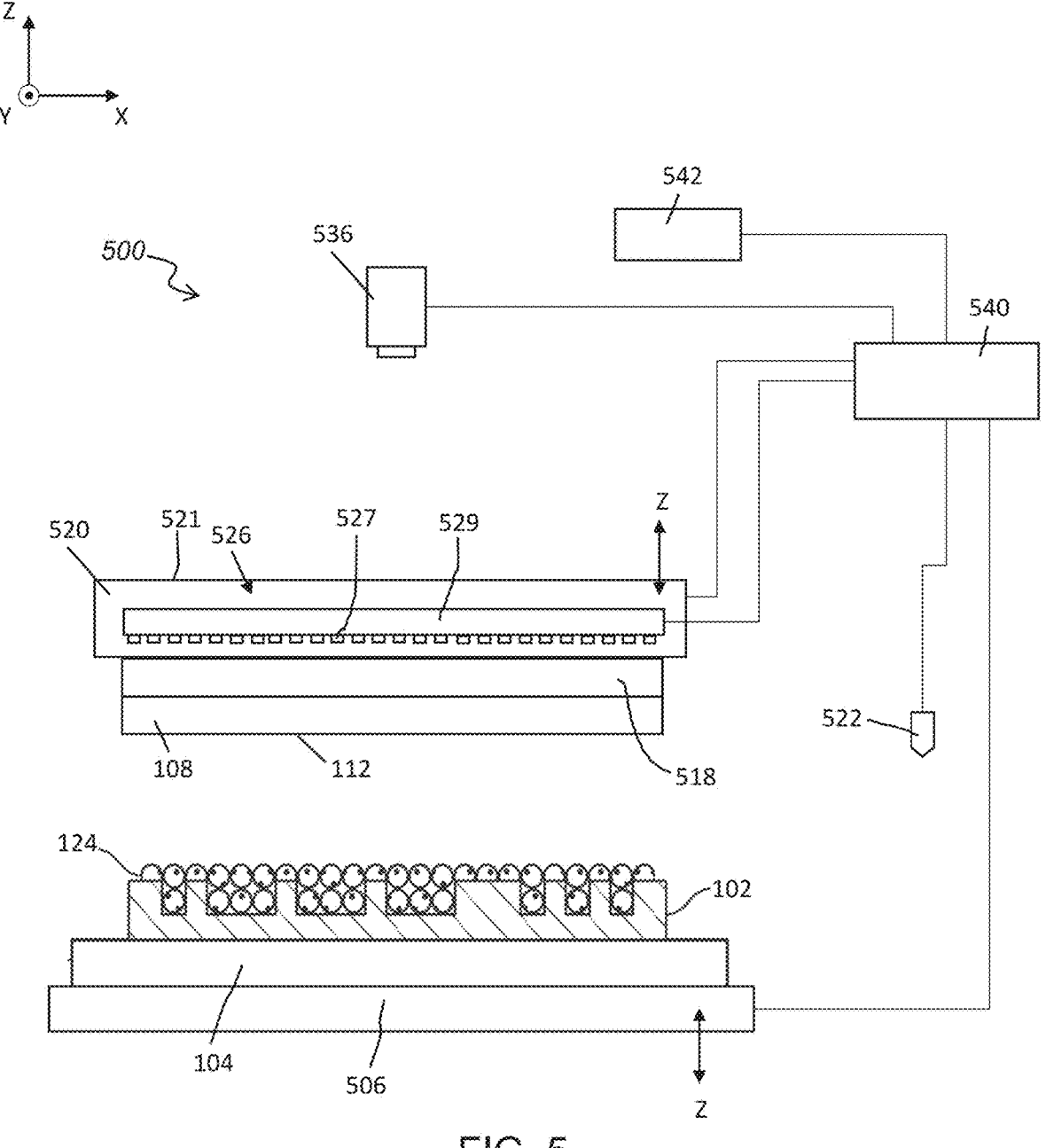
FIG. 5 is a schematic illustration of a cross section of an example planarization system according to some embodiments of the present disclosure.

FIG. 5 illustrates an example system for planarization in accordance with an aspect of the present disclosure. The planarization system 500 is used to planarize a film on a substrate 102. The substrate 102 may be coupled to a substrate chuck 104. The substrate chuck 104 may be but is not limited to a vacuum chuck, pin-type chuck, groove-type chuck, electrostatic chuck, electromagnetic chuck, and/or the like.

The substrate 102 and the substrate chuck 104 may be further supported by a substrate positioning stage 506. The substrate positioning stage 506 may provide translational and/or rotational motion along one or more of: the cartesian x-, y-, z-axes; and three rotation axes. The substrate positioning stage 506, the substrate 102, and the substrate chuck 104 may also be positioned on a base (not shown). The movement of the stage 506 may be controlled by a controller 540, discussed below. The combination of the features that provide for the relative movement and the controller for controlling the movement is referred herein as a positioning system.

The planarization system 500 may comprise a fluid dispenser 522. The fluid dispenser 522 may be used to deposit droplets of liquid formable material 124 (e.g., a photocurable polymerizable material) onto the substrate 102 with the volume of deposited material varying over the area of the substrate 102 based on at least in part upon its topography profile. Different fluid dispensers 522 may use different technologies to dispense formable material 124. When the formable material 124 is jettable, ink jet type dispensers may be used to dispense the formable material. For example, thermal ink jetting, microelectromechanical systems (MEMS) based ink jetting, valve jet, and piezoelectric ink jetting are common techniques for dispensing jettable liquids.

As shown in FIG. 5, the planarization system 500 may comprise a superstrate 108 having a working surface 112 facing and spaced apart from the substrate 102. The superstrate 108 may be formed from materials including, but not limited to, fused silica, quartz, silicon, organic polymers, siloxane polymers, borosilicate glass, fluorocarbon polymers, metal, hardened sapphire, and/or the like. In an embodiment the superstrate 108 is transparent to UV light radiation. The surface 112 is generally of the same areal size as or slightly larger than the surface of the substrate 102.

The planarization system 500 may further include a superstrate chuck 518 and a planarization head 520. The superstrate 108 may be coupled to or retained by the superstrate chuck 518. As noted above, the transparent superstrate chuck may include geometric features such as recesses, lands, and channels that cause non-uniform transmission of the UV passing through it, especially when the recesses, lands, and channels are close to the focal plane of the UV light radiation. The superstrate chuck 518 may be coupled to the planarization head 520. The planarization head 520 may be movably coupled to a bridge (not shown). The planarization head 520 may include one or more actuators such as voice coil motors, piezoelectric motors, linear motor, nut and screw motor, etc., which are configured to move the superstrate chuck 518 relative to the substrate 102 in at least the z-axis direction, and potentially other directions (e.g. x-, y-, and three rotation axes). The aspects of the planarization head that allow for this movement, as controlled by the controller 540, are also components of the positioning system. In operation, either the planarization head 520, the substrate positioning stage 506, or both vary a distance between the superstrate 108 and the substrate 102 to define a desired space (a bounded physical extent in three dimensions) that is filled with the formable material 124. For example, the planarization head 520 may be moved toward the substrate and may apply a force to the superstrate 108 such that the superstrate contacts and spreads droplets of the formable material 124 as further detailed herein. The same effect may also be achieved by moving the substrate 102 toward the superstrate 108, or both can be moved together.

The planarization system 500 may further comprise a camera 536 positioned to view the spread of formable material 124 as the superstrate 108 contacts the formable material 124 during the planarizing process. The camera 536 may include one or more of a CCD, a sensor array, a line camera, and a photodetector which are configured to gather light at a wavelength that shows a contrast between regions underneath the superstrate 108 and in contact with the formable material 124 and regions underneath the superstrate 108 but not in contact with the formable material 124. The camera 536 may be configured to provide images of the spread of formable material 124 underneath the superstrate 108, and/or the separation of the superstrate 108 from cured formable material 124. The camera 536 may also be configured to measure interference fringes, which change as the formable material 124 spreads between the gap between the surface 112 and the substrate surface.

The fluid dispenser 522 may be movably coupled to the bridge. In an embodiment, the fluid dispenser 522 and the planarization head 520 share one or more or all positioning components. The positioning components are part of the positioning system. In an alternative embodiment, the fluid dispenser 522 and the planarization head 520 move independently from each other. The fluid dispenser 522 and the planarization head 520 are moveable so that each can perform their respective functions without interfering with each other.

The planarization system 500 may include a radiation source 526 (also referred herein as an additional light source) that directs actinic energy, for example, UV light radiation, along an exposure path 928. The exposure path 928 passes through the transparent superstrate chuck 518. The transparent superstrate chuck comprises geometric features such as recesses, lands, and channels that cause non-uniform transmission of the UV light radiation emitted by the radiation source 526. There may also be non-uniform transmission of the UV light radiation emitted by the radiation source 526 because high intensity peaks may occur at sharp edges of the superstrate chuck due to Fresnel diffraction at the edges of the geometric features. In an alternative embodiment, the superstrate chuck 518 releases the superstrate 108 and is raised so that the superstrate chuck 518 features do not cause substantial non-uniform transmission of the UV light radiation emitted by the radiation source 526.

Figure 6:
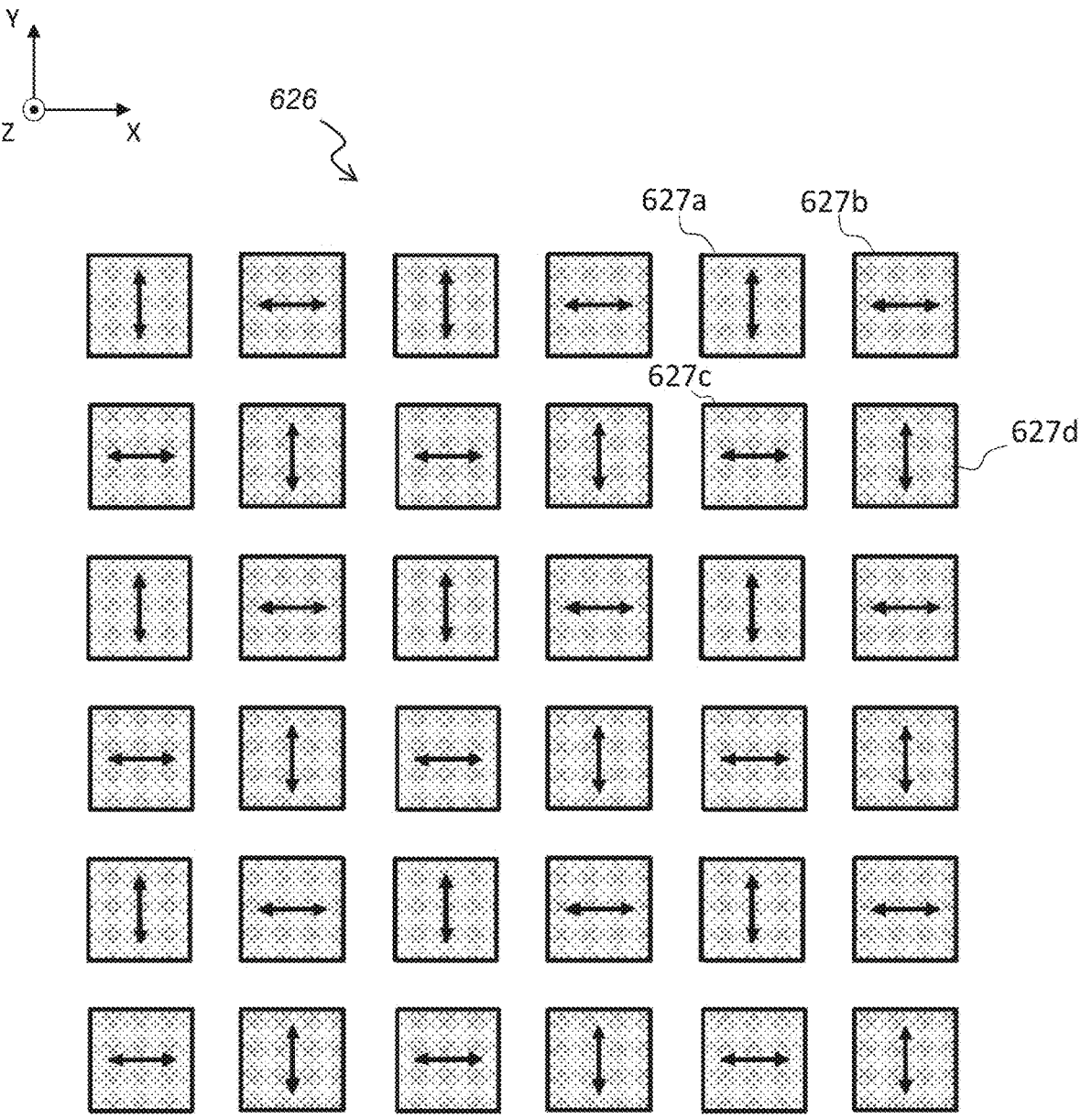
FIG. 6 illustrates a top view of an example array of light emitting diodes (LEDs) according to some embodiments of the present disclosure.
Figure 7:
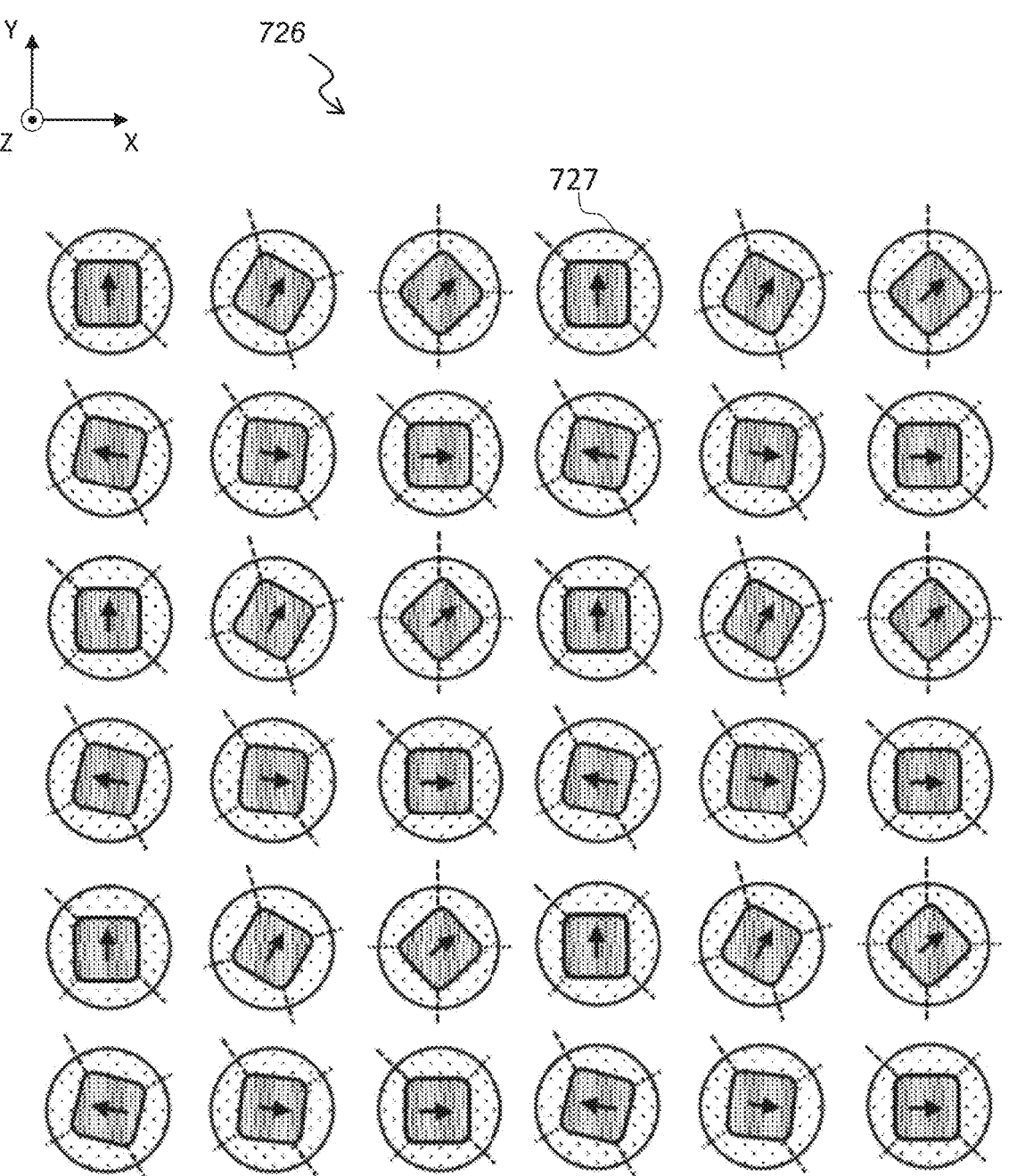
FIG. 7 illustrates a top view of an example array of LEDs according to some embodiments of the present disclosure.
Figure 8:
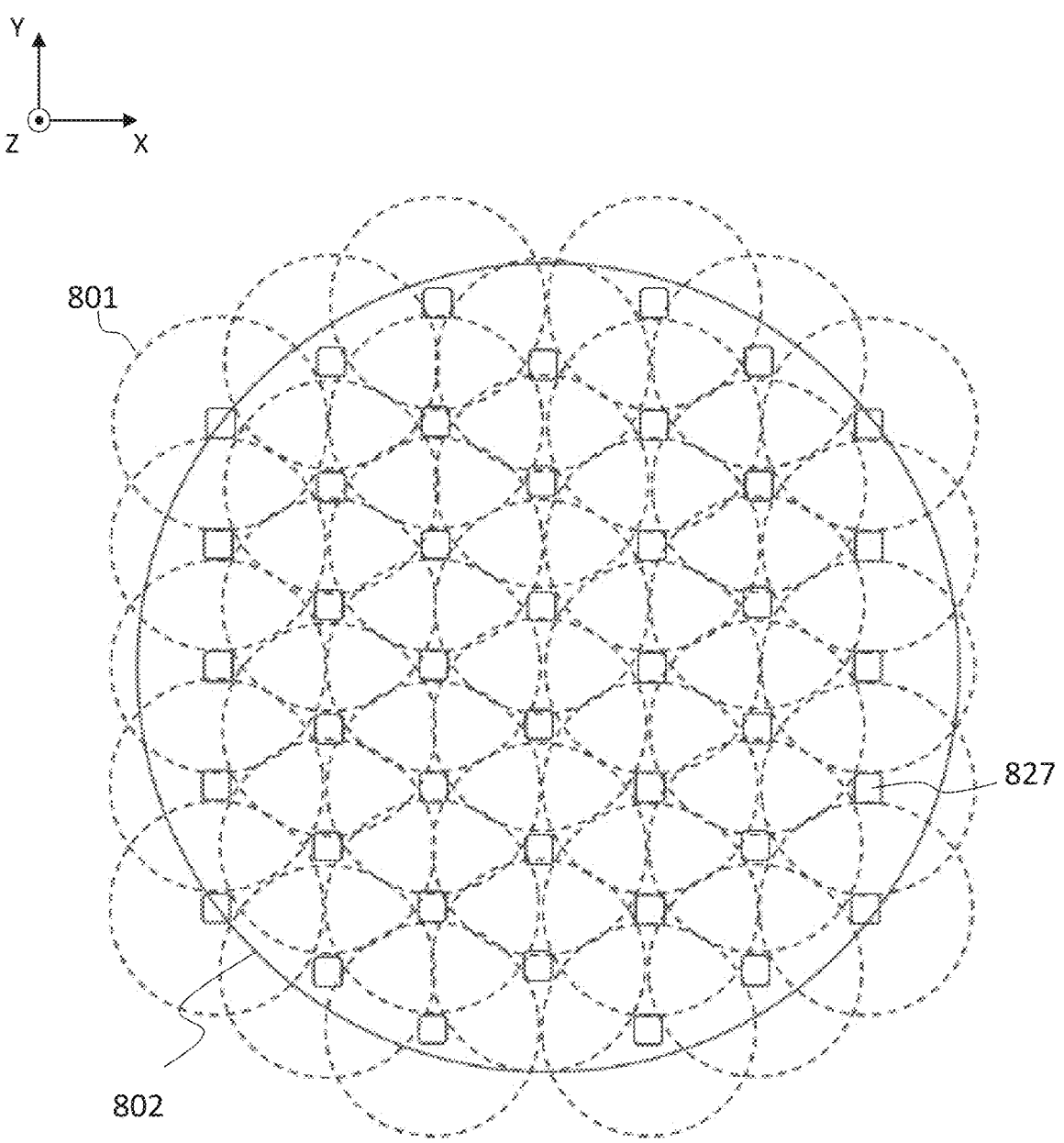
FIG. 8 illustrates a top view of an example array of LEDs according to some embodiments of the present disclosure.

In one example embodiment the radiation source 526 comprises an array of light emitting diodes (LEDs) 527 mounted on a support 529. FIGS. 6-8 illustrate examples of various arrays of LEDs, according to some embodiments of the present disclosure.

In another example embodiment, instead of the radiation source 526 comprising an array or group of LEDs 527, the radiation source 526 may comprise optical components, e.g., quarter wave plates, dichroic mirrors, beam combiners, prisms, lenses, mirrors, etc., to direct light from above the planarization head 520. That is, in another embodiment, the radiation (light) may originate form a source located well above the planarization head (i.e., above an upper end 521 of the planarization head) and the radiation may be directed through the planarization head and through the superstrate resulting in the same exposure pattern of the array of LEDs of the illustrated embodiment. In such a case, the radiation source may comprise a mercury bulb or mercury-xenon for example. Light emitted from a bulb type source that is directed using optical component, as opposed to an array of LEDs, can still provide sufficient energy to cure the formable material even though the bulb is located much farther away from the formable material 124. When a bulb type source is used, it is located well above the planarization head 520 so that the heat produced by the bulb does not impact the materials.

The planarization system 500 may be regulated, controlled, and/or directed by one or more processors 540 (controller) in communication with one or more components and/or subsystems such as the substrate chuck 104, the substrate positioning stage 506, the superstrate chuck 518, the fluid dispenser 522, the planarization head 520, the camera 536, the radiation source 526. The processor 540 may operate based on instructions in a computer readable program stored in a non-transitory computer memory 542. The processor 540 may be or include one or more of a CPU, MPU, GPU, ASIC, FPGA, DSP, and a general-purpose computer. The processor 540 may be a purpose-built controller or may be a general-purpose computing device that is adapted to be a controller. Examples of a non-transitory computer readable memory include but are not limited to RAM, ROM, CD, DVD, Blu-Ray, hard drive, networked attached storage (NAS), an intranet connected non-transitory computer readable storage device, and an internet connected non-transitory computer readable storage device. All of the method steps described herein may be executed by the processor 540 and/or by components controlled by the processor 540. As noted above, the features that provide for movement and control of the movement for the various components of the system are a positioning system.

FIG. 6 illustrates a top view of an example array of light emitting diodes (LEDs) according to some embodiments of the present disclosure. In FIG. 6, a light source 626 includes an array of LEDs having orthogonal polarizations. For example, LED 627*a*, LED 627*b*, LED 627*c*, and LED 627*d* have polarizations which are orthogonal relative to adjacent LEDs. FIG. 7 illustrates a top view of an example array of LEDs according to some embodiments of the present disclosure. In FIG. 7, each LED 727 of the light source 726 includes a quarter waveplate in order to transform linearly polarized light into circular polarized light. The LEDs shown in FIG. 6 and FIG. 7 may be arranged as shown or in a similar pattern so that light for the LEDs overlaps on the surface of the substrate such that the entire substrate surface will receive light that is both TM and TE polarized light. Furthermore, FIG. 8 illustrates LEDs 827 arranged in a pattern such that overlapping light will be applied to the entirety of the substrate surface. FIG. 8 illustrates a top view of an example array of LEDs according to some embodiments of the present disclosure. FIG. 8 shows an example layout of an array of LEDs 827. The dash-line circles 801 show the exposure range for each of the LEDs 827. The arrangement of the LEDs 827 allows the whole wafer 802 to be exposed by the UV light with the predetermined intensity.

Each of the LED 627*a*, LED 627*b*, LED 627*c*, and LED 627*d* or LEDs 727 or LEDs 827 may be arranged linearly on the support 529. The support 529 may have a circular shape and be the same size or slightly larger than the substrate 102. The wavelength of the light emitted may be 300 to 400 nm. In an alternative embodiment, one or more sensors of the camera 536 may be integrated with the LEDs 527 of the radiation source. In another alternative embodiment, an optical combiner (not shown) may be used to direct light from the radiation source 526 through the superstrate 108 while allowing light from the substrate 102 to be gathered by the camera 536.

As shown in FIG. 5, the radiation source 526 may be mounted within the planarization head 520. Such an arrangement reduces the overall space required by the planarization system 500. Furthermore, for the array of LEDs 527 to be most effective, the array of LEDs 527 should be close to the surface of the formable material 124 being cured. However, in some instances it may be adequate for the array of LEDs 527 to be located above the planarization head 520. The array of LEDs 527 of the radiation source may be directed downwardly such that the LEDs 527 are not angled relative to a vertical line, i.e., a line in the Z direction. More particularly, the center of the beam emitted by each of the LEDs 527 travels in a vertical line parallel to the Z direction. In other words, the angle of the center of the beam emitted by each of the LEDs 527 is 0° relative to the vertical line.

Figure 9:
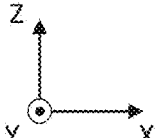
FIG. 9 is a schematic illustration of a cross section of an example planarization system according to some embodiments of the present disclosure.
Figure 9:
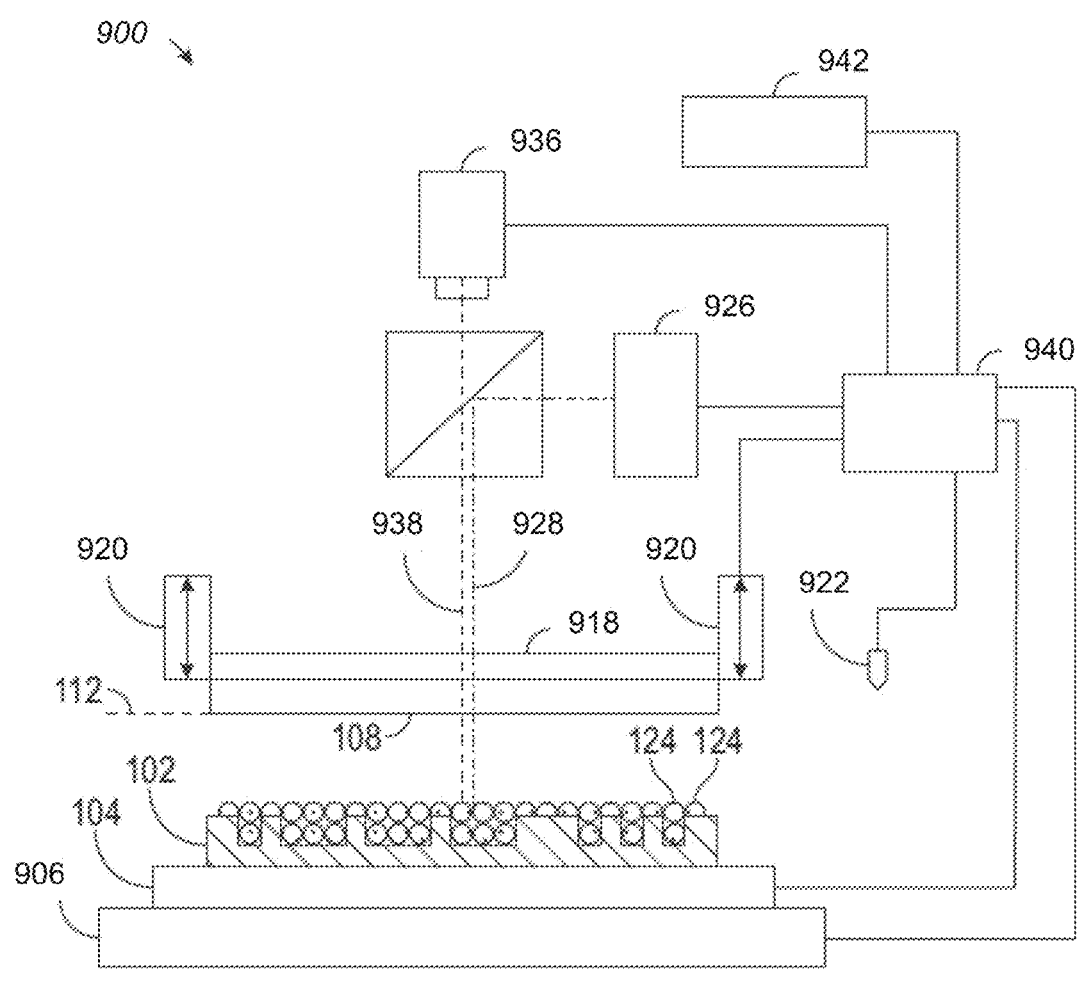

FIG. 9 is a schematic illustration of a cross section of an example planarization system according to some embodiments of the present disclosure. FIG. 9 illustrates an apparatus 900 that, among other things, can be used to planarize a film on a substrate 102. The substrate 102 may be coupled to a substrate chuck 104. The substrate chuck 104 may be but is not limited to a vacuum chuck, pin-type chuck, groove-type chuck, electrostatic chuck, electromagnetic chuck, and/or the like.

The substrate 102 and the substrate chuck 104 may be further supported by a substrate positioning stage 906. The substrate positioning stage 906 may provide translational and/or rotational motion along one or more of the x-, y-, z-, θ-, ψ, and φ-axes. The substrate positioning stage 906, the substrate 102, and the substrate chuck 104 may also be positioned on a base (not shown). The substrate positioning stage may be a part of a positioning system.

Spaced apart from the substrate 102 is a superstrate 108 having a working surface 112 facing substrate 102. Superstrate 108 may be formed from materials including, but not limited to, fused silica, quartz, silicon, organic polymers, siloxane polymers, borosilicate glass, fluorocarbon polymers, metal, hardened sapphire, and/or the like. In an embodiment the superstrate is readily transparent to UV light. Surface 112 is generally of the same areal size or slightly smaller as the surface of the substrate 108. Surface 112 of superstrate 108 can include a planar contact surface. In another embodiment, the contact surface can include features that define any original pattern that forms the basis of a pattern to be formed on the substrate 102.

Superstrate 108 may be coupled to or retained by a superstrate chuck 918. The superstrate chuck 918 may be, but is not limited to, vacuum chuck, pin-type chuck, groove-type chuck, electrostatic chuck, electromagnetic chuck, and/or other similar chuck types. The superstrate chuck 918 may be configured to apply stress, pressure, and/or strain to superstrate 108 that varies across the superstrate 108. In an embodiment the superstrate chuck is likewise readily transparent to UV light. The superstrate chuck 918 may include a system such as a zone based vacuum chuck, an actuator array, a pressure bladder, etc., which can apply a pressure differential to a back surface of the superstrate 108 to cause the template to bend and deform. In one embodiment, the superstrate chuck 918 includes a zone based vacuum chuck which can apply a pressure differential to a back surface of the superstrate, causing the superstrate to bend and deform as further detailed herein.

The superstrate chuck 918 may be coupled to a head 920 which is a part of the positioning system. The head 920 may be movably coupled to a bridge. The head 920 may include one or more actuators such as voice coil motors, piezoelectric motors, linear motor, nut and screw motor, etc., which are configured to move the superstrate chuck 918 relative to the substrate 102 in at least the z-axis direction, and potentially other directions (e.g. x-, y-, θ-, ψ-, and φ-axis).

The apparatus 900 may further comprise a fluid dispenser 922. The fluid dispenser 922 may also be movably coupled to the bridge. In an embodiment, the fluid dispenser 922 and the head 920 share one or more of all positioning components. In an alternative embodiment, the fluid dispenser 922 and the head move independently from each other. The fluid dispenser 922 may be used to deposit droplets of liquid formable material 124 (e.g., a photocurable polymerizable material) onto the substrate 102 with the volume of deposited material varying over the area of the substrate 102 based on at least in part upon its topography profile. Different fluid dispensers 922 may use different technologies to dispense formable material 124. When the formable material 124 is jettable, ink jet type dispensers may be used to dispense the formable material. For example, thermal ink jetting, micro-electromechanical systems (MEMS) based ink jetting, valve jet, and piezoelectric ink jetting are common techniques for dispensing jettable liquids.

The apparatus 900 further comprises a curing system that includes a radiation source 926 that directs actinic energy, for example, UV radiation, along an exposure path 928. The head 920 and the substrate positioning state 906 may be configured to position the superstrate 108 and the substrate 102 in superimposition with the exposure path 928. The radiation source 926 sends the actinic energy along the exposure path 928 after the superstrate 108 has contacted the formable material 124. FIG. 9 illustrates the exposure path 928 when the superstrate 108 is not in contact with the formable material 124. This is done for illustrative purposes so that the relative position of the individual components can be easily identified. An individual skilled in the art would understand that exposure path 928 would not substantially change when the superstrate 108 is brought into contact with the formable material 124.

The apparatus 900 further comprises a camera 936 positioned to view the spread of formable material 124 as the superstrate 108 contacts the formable material 124 during the planarization process. FIG. 9 illustrates an optical axis 938 of the field camera's imaging field. As illustrated in FIG. 9, the apparatus 900 may include one or more optical components (dichroic mirrors, beam combiners, prisms, lenses, mirrors, etc.) which combine the actinic radiation with light to be detected by the camera 936. The camera 936 may include one or more of a CCD, a sensor array, a line camera, and a photodetector which are configured to gather light at a wavelength that shows a contrast between regions underneath the superstrate 108 and in contact with the formable material 124 and regions underneath the superstrate 108 but not in contact with the formable material 124. The camera 936 may be configured to provide images of the spread of formable material 124 underneath the superstrate 108, and/or the separation of the superstrate 108 from cured formable material 124. The camera 936 may also be configured to measure interference fringes, which change as the formable material 124 spreads between the gap between the surface 112 and the substrate surface.

The apparatus 900 may be regulated, controlled, and/or directed by one or more processors 940 (controller) in communication with one or more components and/or subsystems such as the substrate chuck 104, the substrate positioning stage 906, the superstrate chuck 918, the head 920, the fluid dispenser 922, the radiation source 926, and/or the camera 936. The processor 940 may operate based on instructions in a computer readable program stored in a non-transitory computer memory 942. The processor 940 may be or include one or more of a CPU, MPU, GPU, ASIC, FPGA, DSP, and a general-purpose computer. The processor

940 may be a purpose-built controller or may be a general-purpose computing device that is adapted to be a controller. Examples of a non-transitory computer readable memory include but are not limited to RAM, ROM, CD, DVD, Blu-Ray, hard drive, networked attached storage (NAS), an intranet connected non-transitory computer readable storage device, and an internet connected non-transitory computer readable storage device.

In operation, the planarization head 920, the substrate position stage 906, or both vary a distance between the superstrate 108 and the substrate 102 to define a desired space (a bounded physical extent in three dimensions) that is filled with the formable material 124. For example, the head 920 may be moved toward the substrate and apply a force to the superstrate 108 such that the superstrate contacts and spreads droplets of the formable material 124 as further detailed herein. The apparatus 900 may have features such as illustrated in FIG. 10, 11, or 12, according to some embodiments.

Figure 10:
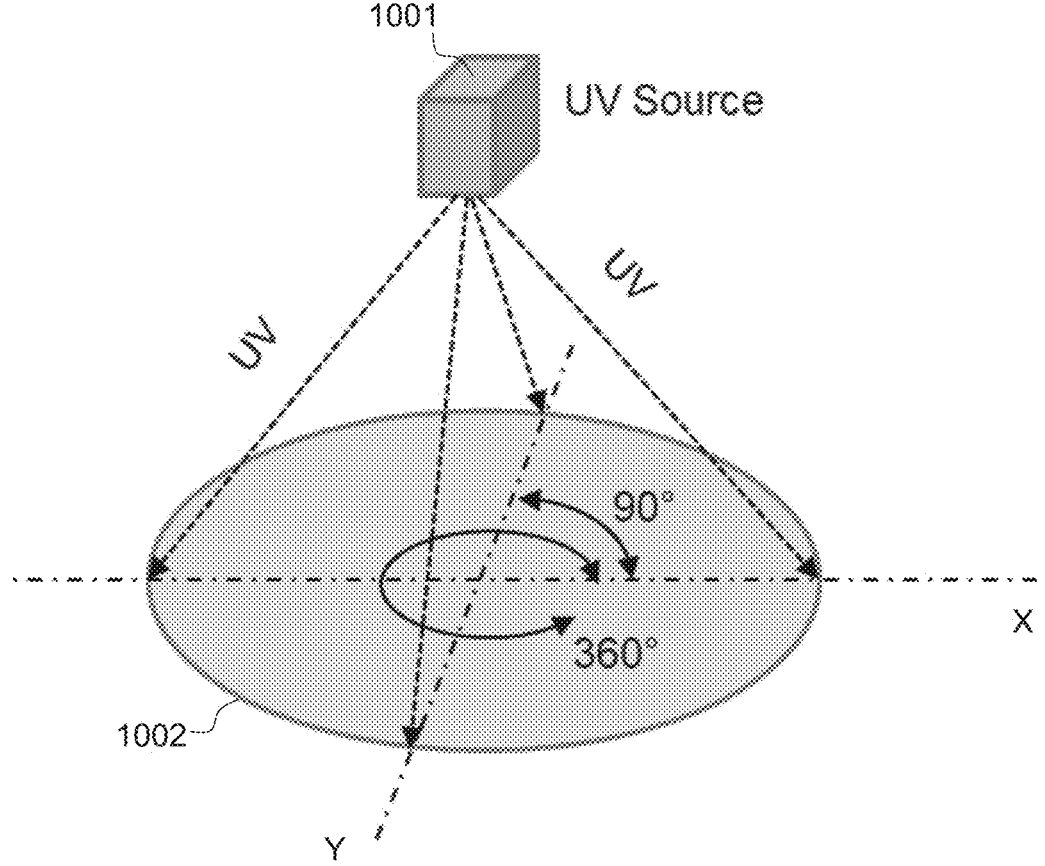
FIG. 10 illustrates a light source providing a uniform distribution of light to a surface of formable material according to some embodiments of the present disclosure.

FIG. 10 illustrates a light source providing a uniform distribution of light to a surface of formable material according to some embodiments of the present disclosure. In FIG. 10, a single light source 1001 is stationary, while the stage 906 rotates the surface of the formable material 1002 in contact with a featureless surface of the superstrate. The surface of the formable material 1002 may be rotated 360 degrees continuously or, alternatively, may be rotated back and forth at 90 degrees. By virtue of the rotation, the surface of the formable material 1002 will be irradiated with orthogonally polarized light.

Figure 11:
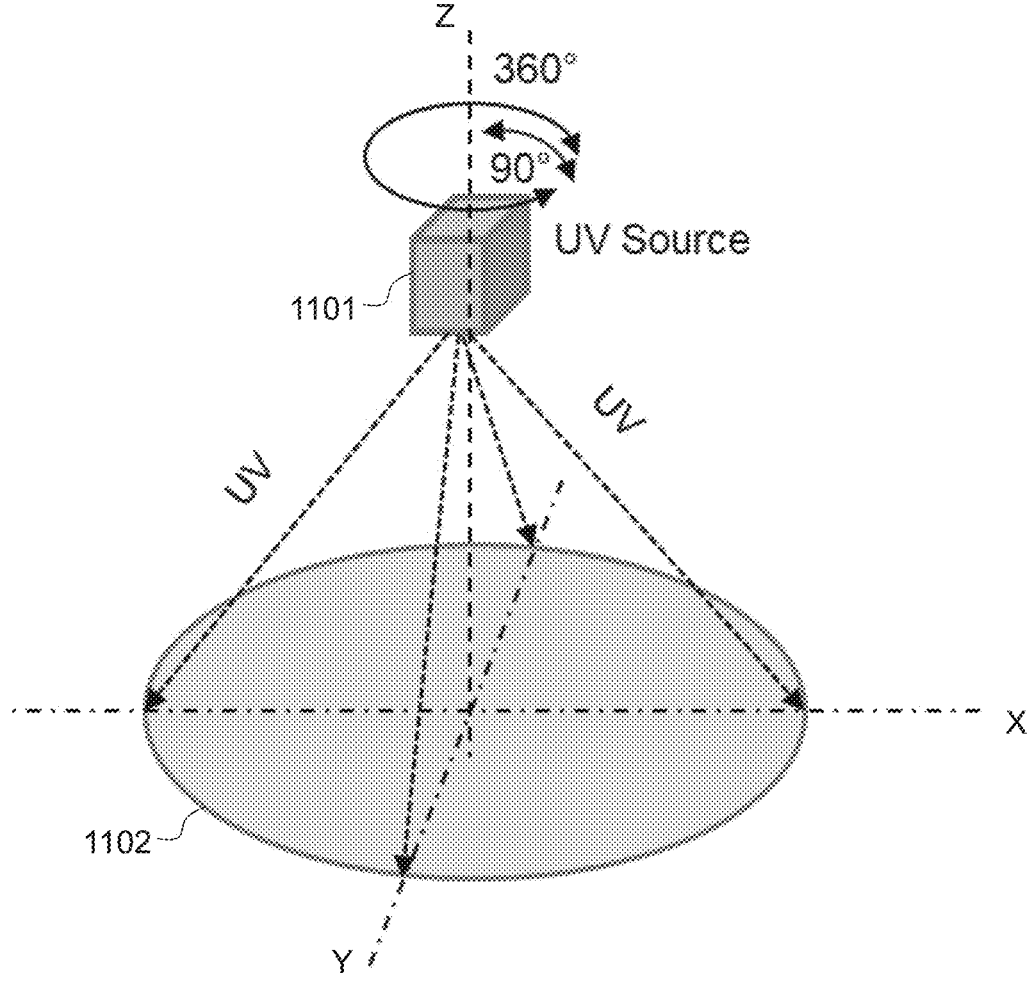
FIG. 11 illustrates a light source providing a uniform distribution of light to a surface of formable material according to some embodiments of the present disclosure.

FIG. 11 illustrates a light source providing a uniform distribution of light to a surface of formable material according to some embodiments of the present disclosure. In FIG. 11, a single light source 1101 is rotated, while the surface of the formable material 1102 in contact with a featureless surface of the superstrate is stationary. The light source 1101 may be rotated 360 degrees continuously or, alternatively, may be rotated back and forth at 90 degrees. By virtue of the rotation, the surface of the formable material 1102 will be irradiated with polarized light that is orthogonal to the features of the substrate no matter the orientation of the features.

Figure 12:
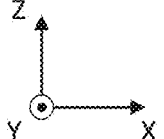
FIG. 12 illustrates a quarter waveplate according to some embodiments of the present disclosure.
Figure 12:
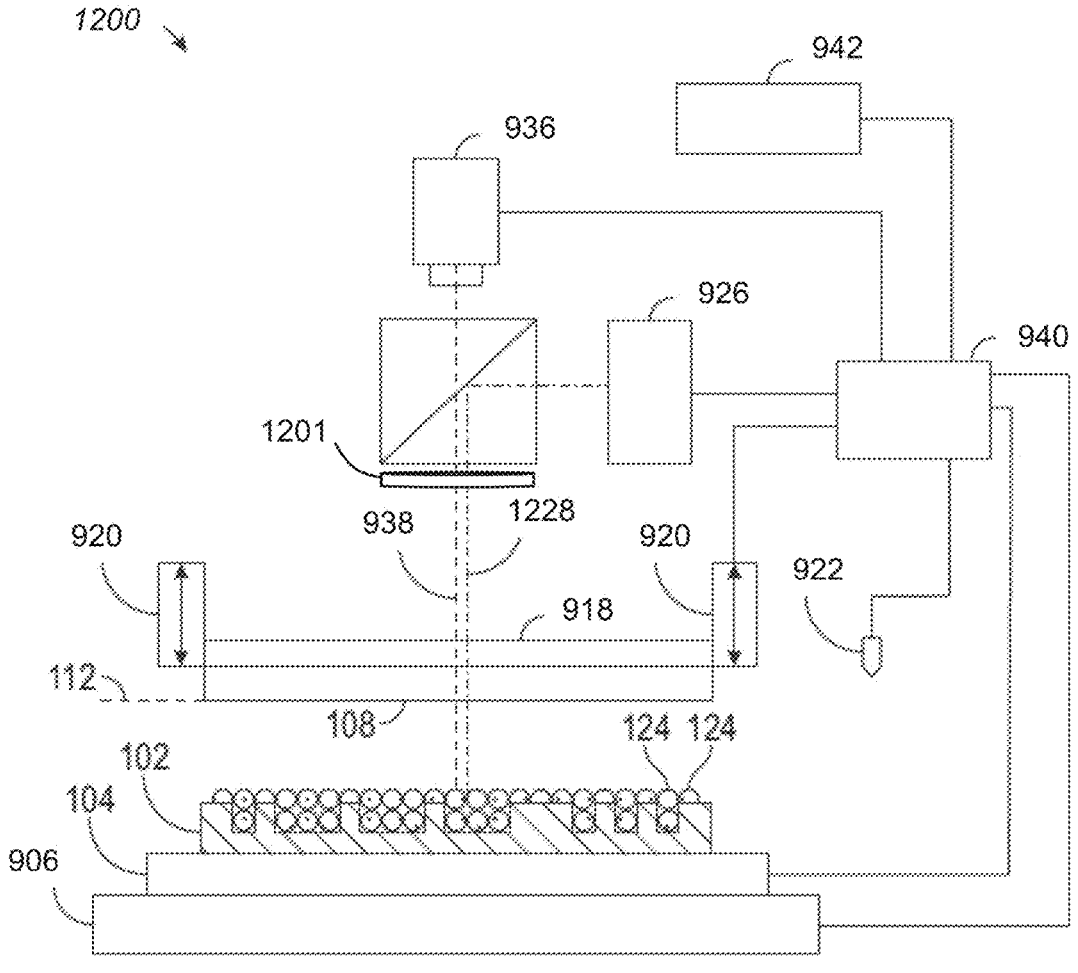

FIG. 12 illustrates a system 1200 that includes all the features of apparatus 900 but additionally includes a quarter waveplate 1201. By virtue of the quarter waveplate, light in the exposure path 1228 will be circularly polarized. Thus, the light that irradiated the formable material will include polarized light that can provide sufficient intensity within trenches of various widths and orientations, such as shown in FIG. 3.

FIG. 13 illustrates an operational flow of an example planarization method according to some embodiments of the present disclosure. In step S1301, a formable material is deposited on a substrate, such as the substrate 102. The formable material may be a curable material deposited on the substrate. The formable material dispensed onto substrate 102 may be dispensed in the form of droplets.

In step S1302, the substrate 102 having the formable material 124 is planarized using the planarizing head 520 to form a multilayered structure. As noted above, using the positioning system, the planarization head 520 may be moved toward the substrate 102 to apply a force to the superstrate 108 such that the superstrate 108 contacts and spreads droplets of the formable material 124. FIG. 1B illustrates a post-contact step after the superstrate 108 has been brought into full contact with the formable material 124. As the superstrate 108 contacts the formable material 124, the droplets merge to form a formable material film 144 that fills the space between the superstrate 108 and the substrate 102. Preferably, the filling process happens in a uniform manner without any air or gas bubbles being trapped between the superstrate 108 and the substrate 102 in order to minimize non-fill defects. In some embodiments, the superstrate 108 and/or the substrate 102 is supported by a controlled back pressure from the substrate chuck 104 and/or superstrate chuck 518 to make the formable material 124 spread without trapping voids. The spreading starts from the center of the substrate 102 and ends at the boundary of the active area of the substrate 102. At the moment shown in the FIG. 1B, the step S1302 has been completed. Furthermore, at this moment, while the superstrate 108 is still in contact with the formable material 124, a multilayer structure has been formed. In particular, the multilayer structure comprises or consists of the superstrate 108, the formable material film 144, and the substrate 102, in that order. In another aspect, the multilayer structure may also be considered to comprise or consist of the superstrate 108, the formable material film 144, the substrate 102, and the substrate chuck 104, in that order. In either case, as shown in FIG. 1B, in the multilayer structure, the underside surface 112 of the superstrate 108 is in direct contact with the upper surface of the formable material film 144, while the underside surface of the formable material film 144 is in direct contact with the upper surface of the substrate 102.

In step S1303, a uniform distribution of light is supplied to the formable material in contact with the surface of the superstate using a plurality of light sources having different polarizations. For example, a uniform distribution of light may be applied using a system such as discussed with reference to FIGS. 5-8.

In step S1304, the superstrate 108 is separated from cured planarized layer 146. To remove the superstrate 108 from the cured planarized layer 146 the superstrate chuck 518 may be coupled once again to the superstrate 108 (i.e., rechucking the superstrate 108) via operation of the planarization head 520, while the superstrate 108 is still in contact with the cured planarized layer 146. In order to couple the superstrate chuck 518 with the superstrate 108, at least one of the planarization head 520 and the stage 506 is moved using the positioning system in the Z direction until the superstrate chuck 518 comes into contact with the superstrate 108. Preferably, only one of the planarization head 520 and stage 506 is moved in the Z direction using the positioning system, while the other is stationary. In a preferred embodiment planarization head 520 moves downwardly in the Z direction while the stage 106 remains stationary. However, in some instances both may be moved.

Once the superstrate 108 is coupled with the superstrate chuck 518, the superstrate chuck 518 may begin to lift upwardly away from the substrate 102 by using the positioning system to move the planarization head 520 upwardly or using the positioning system to move the stage 506 downward in the Z direction. As noted above, both could also be moved. Because the superstrate 108 is coupled with superstrate chuck 518, the lifting force (or lowering force) will cause the superstrate 108 to separate from the cured planarized layer 146.

FIG. 14 illustrates an operational flow of an example planarization method according to some embodiments of the present disclosure. In step S1401, a formable material is deposited on a substrate, such as the substrate 102. The formable material may be a curable material deposited on the substrate. The formable material dispensed onto the substrate 102 may be dispensed in the form of droplets.

In step S1402, the substrate 102 having the formable material 124 is planarized using the planarizing head 920 to form a multilayered structure. As noted above, using the positioning system, the planarization head 920 may be moved toward the substrate 102 to apply a force to the superstrate 108 such that the superstrate 108 contacts and spreads droplets of the formable material 124. FIG. 1B illustrates a post-contact step after the superstrate 108 has been brought into full contact with the formable material 124. As the superstrate 108 contacts the formable material 124, the droplets merge to form a formable material film 144 that fills the space between the superstrate 108 and the substrate 102. Preferably, the filling process happens in a uniform manner without any air or gas bubbles being trapped between the superstrate 108 and the substrate 102 in order to minimize non-fill defects. In some embodiments, the superstrate 108 and/or the substrate 102 is supported by a controlled back pressure from the substrate chuck 104 and/or superstrate chuck 918 to make the formable material 124 spread without trapping voids. The spreading starts from the center of the substrate 102 and ends at the boundary of the active area of the substrate 102. At the moment shown in the FIG. 1B, the step S1402 has been completed. Furthermore, at this moment, while the superstrate 108 is still in contact with the formable material 124, a multilayer structure has been formed. In particular, the multilayer structure comprises or consists of the superstrate 108, the formable material film 144, and the substrate 102, in that order. In another aspect, the multilayer structure may also be considered to comprise or consist of the superstrate 108, the formable material film 144, the substrate 102, and the substrate chuck 104, in that order. In either case, as shown in FIG. 1B, in the multilayer structure, the underside surface 112 of the superstrate 108 is in direct contact with the upper surface of the formable material film 144, while the underside surface of the formable material film 144 is in direct contact with the upper surface of the substrate 102.

In step S1403, a uniform distribution of light is supplied to the formable material in contact with the surface of the superstate using a light source such as discussed with reference to FIG. 9.

Then, in step S1404, one or more of the substrate (as in FIG. 10), the light source (as in FIG. 11), and the quarter waveplate (such as illustrated in FIG. 12) is rotated. The rotating in step S1404 is based on an orientation of a trench in the substrate with a width that is less than a wavelength of the uniform distribution of light.

In step S1405, the superstrate 108 is separated from the cured planarized layer 146. To remove the superstrate 108 from the cured planarized layer 146 the superstrate chuck 918 may be coupled once again to the superstrate 108 (i.e., rechucking the superstrate 108) via operation of the planarization head 920, while the superstrate 108 is still in contact with the cured planarized layer 146. In order to couple the superstrate chuck 918 with the superstrate 108, at least one of the planarization head 920 and the stage 906 is moved using the positioning system in the Z direction until the superstrate chuck 918 comes into contact with the superstrate 108. Preferably, only one of the planarization head 920 and stage 906 is moved in the Z direction using the positioning system, while the other is stationary. In a preferred embodiment planarization head 920 moves downwardly in the Z direction while the stage 106 remains stationary. However, in some instances both may be moved.

Once the superstrate 108 is coupled with the superstrate chuck 918, the superstrate chuck 918 may begin to lift upwardly away from the substrate 102 by using the positioning system to move the planarization head 920 upwardly or using the positioning system to move the stage 906 downward in the Z direction. As noted above, both could also be moved. Because the superstrate 108 is coupled with superstrate chuck 918, the lifting force (or lowering force) will cause the superstrate 108 to separate from the cured planarized layer 146.

The above description serves to explain principles of the disclosure; but the disclosure should not be limited to the examples described above. For example, the order and/or timing of some of the various operations may vary from the examples given above without departing from the scope of the disclosure. Other variations from the examples given above may also exist without departing from the scope of the disclosure. For example, various features of the illustrated examples could be modified, rearranged, or removed, or one or more features could be added without departing from the scope of the disclosure.

The scope of the present disclosure includes a computer-readable medium storing instructions that, when executed by one or more processors, cause the one or more processors to perform one or more embodiments of the disclosure described herein. Examples of a computer-readable medium include a hard disk, a floppy disk, a magneto-optical disk (MO), a compact-disk read-only memory (CD-ROM), a compact disk recordable (CD-R), a CD-Rewritable (CD-RW), a digital versatile disk ROM (DVD-ROM), a DVD-RAM, a DVD-RW, a DVD+RW, magnetic tape, a nonvolatile memory card, and a ROM. Computer-executable instructions can also be supplied to the computer-readable storage medium by being downloaded via a network.

While certain embodiments have been described, these embodiments have been presented by way of example only and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions. Thus, the scope of the claims is not limited to the above-described embodiments and includes various modifications and equivalent arrangements.

What is claimed is:

1. An apparatus for curing formable material between a substrate and a superstrate, the apparatus comprising:

a substrate chuck configured to hold the substrate;

a superstrate chuck configured to hold the superstrate, wherein the superstrate chuck is transparent to UV light; and a plurality of light sources configured to provide a uniform distribution of light to a surface of the formable material in contact with a featureless surface of the superstrate, wherein the plurality of light sources have mixed polarizations relative to each other, wherein the formable material between the substrate and the superstrate is on a surface of the substrate that includes a trench feature, and wherein a width of the trench feature is smaller than half an effective wavelength of the light provided by the plurality of light sources by a predetermined amount, and wherein the effective wavelength equals a vacuum wavelength of the light provided by the plurality of light sources divided by a refractive index of the formable material.

2. The apparatus of claim 1, wherein the uniform distribution of light is linearly polarized light in at least two orthogonal directions.

3. The apparatus of claim 1, wherein the uniform distribution of light is circularly polarized light.

4. The apparatus of claim 1, further comprising:

a plurality of quarter-wavelength plates, wherein each quarter-wavelength plate of the plurality of quarter-wavelength plates is configured to transform polarized light of a respective light source of the plurality of light sources into circular polarized light.

5. The apparatus of claim 1, wherein the superstrate is transparent to each of the plurality of light sources.

6. The apparatus of claim 1, wherein the formable material between the substrate and the superstrate forms a planarized layer on the substrate upon receiving the light provided by the plurality of light sources.

7. The apparatus of claim 1, wherein the surface of the substrate includes the trench feature and a second trench feature, wherein an orientation of the second trench feature in the substrate is different from an orientation of the trench feature in the substrate, and wherein a width of the second trench feature is smaller than half the effective wavelength of the light provided by the plurality of light sources by the predetermined amount.

* * * * *